US012765398B2

(12) United States Patent
Otremba et al.

(10) Patent No.: US 12,765,398 B2
(45) Date of Patent: Oct. 13, 2026

(54) SEMICONDUCTOR PACKAGE WITH HYBRID INTERCONNECT CLIP

(71) Applicant: Infineon Technologies AG, Neubiberg (DE)

(72) Inventors: Ralf Otremba, Kaufbeuren (DE); Markus Dinkel, Unterhaching (DE); Thai Kee Gan, Melaka Tengah (MY); Teck Sim Lee, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 391 days.

(21) Appl. No.: 18/597,338

(22) Filed: Mar. 6, 2024

(65) Prior Publication Data

US 2025/0286011 A1 Sep. 11, 2025

(51) Int. Cl.

| | |
|---|---|
| ***H10W 70/40*** | (2026.01) |
| ***H10W 74/10*** | (2026.01) |
| *H10W 72/00* | (2026.01) |
| *H10W 90/00* | (2026.01) |

(52) U.S. Cl.

CPC ....... *H10W 70/464* (2026.01); *H10W 70/417* (2026.01); *H10W 70/427* (2026.01); *H10W 70/442* (2026.01); *H10W 74/111* (2026.01); *H10W 72/073* (2026.01); *H10W 72/07336* (2026.01); *H10W 72/076* (2026.01); *H10W 72/07636* (2026.01); *H10W 72/886* (2026.01); *H10W 90/736* (2026.01); *H10W 90/763* (2026.01)

(58) Field of Classification Search

CPC ............. H10W 70/427; H10W 70/442; H10W 70/464; H10W 74/111; H10W 70/417

See application file for complete search history.

(56) References Cited

U.S. PATENT DOCUMENTS

| | | | | |
|---|---|---|---|---|
| 8,519,545 | B2 | 8/2013 | Otremba | |
| 2005/0006731 | A1* | 1/2005 | O'Shea | H10W 70/427 257/666 |
| 2015/0115313 | A1* | 4/2015 | Otremba | H10W 70/481 257/124 |
| 2022/0013439 | A1 | 1/2022 | Stella et al. | |
| 2022/0102254 | A1 | 3/2022 | Chew | |
| 2022/0148943 | A1 | 5/2022 | Uchida et al. | |
| 2022/0173023 | A1 | 6/2022 | Otremba | |
| 2023/0094566 | A1 | 3/2023 | Theuss | |

* cited by examiner

*Primary Examiner* — Peter M Albrecht

(74) *Attorney, Agent, or Firm* — Murphy, Bilak & Homiller, PLLC

(57) ABSTRACT

A method includes providing first and second lead frames, each including a die pad and a plurality of contacts, providing first and second semiconductor dies, each comprising a first terminal and a second terminal, providing a first clip frame that includes a first die mating pad, a second die mating pad, and a bridge section, mounting the first semiconductor die on the first lead frame, mounting the second semiconductor die on the second lead frame, and attaching the first clip frame to the first and second semiconductor dies such that the first die mating pad faces and electrically connects with the first terminal of the first semiconductor die and such that the second die mating pad faces and electrically connects with the first terminal of the second semiconductor die.

21 Claims, 5 Drawing Sheets

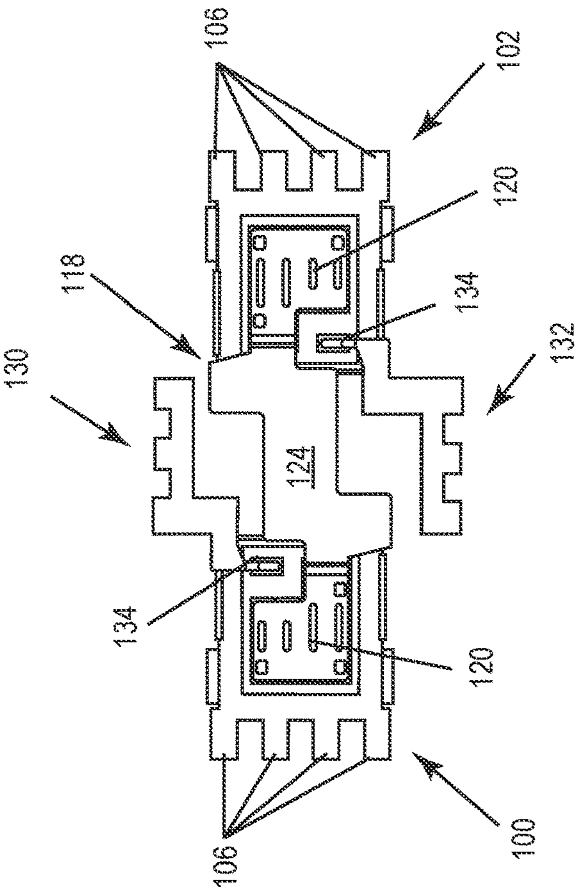
FIG. 3B
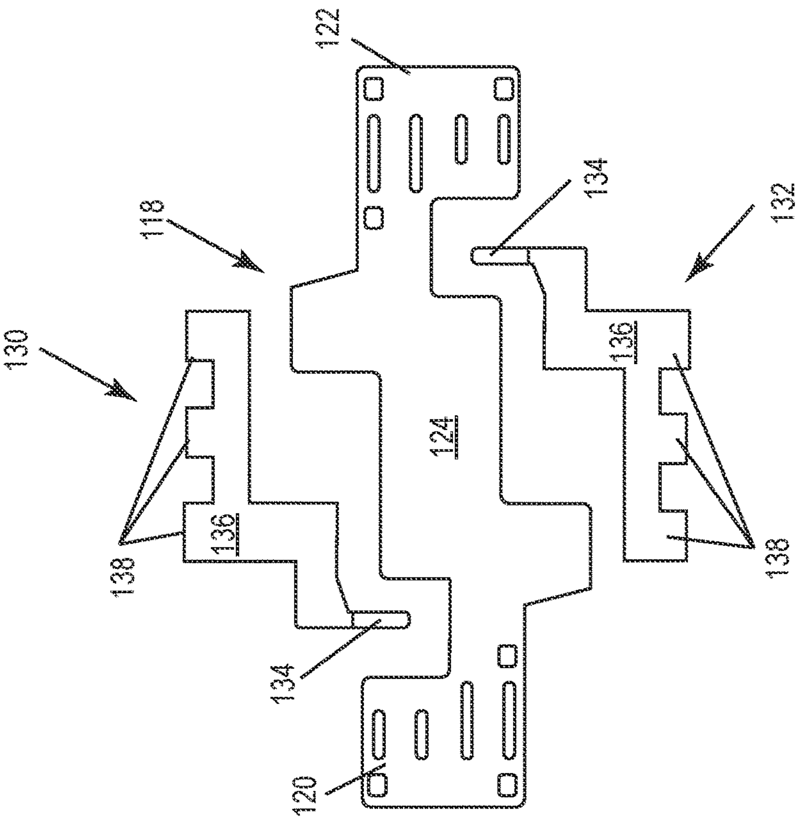
FIG. 3A
FIGURE 3

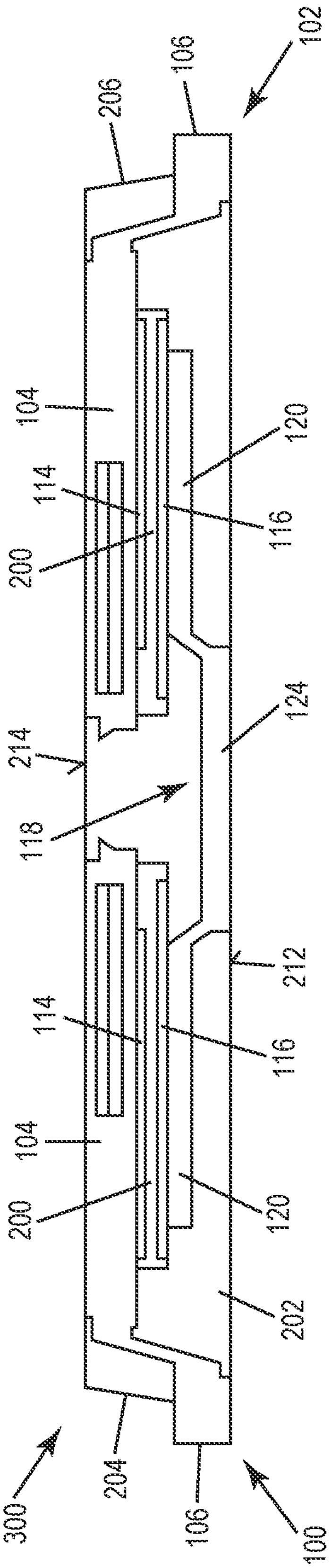
FIG. 4A
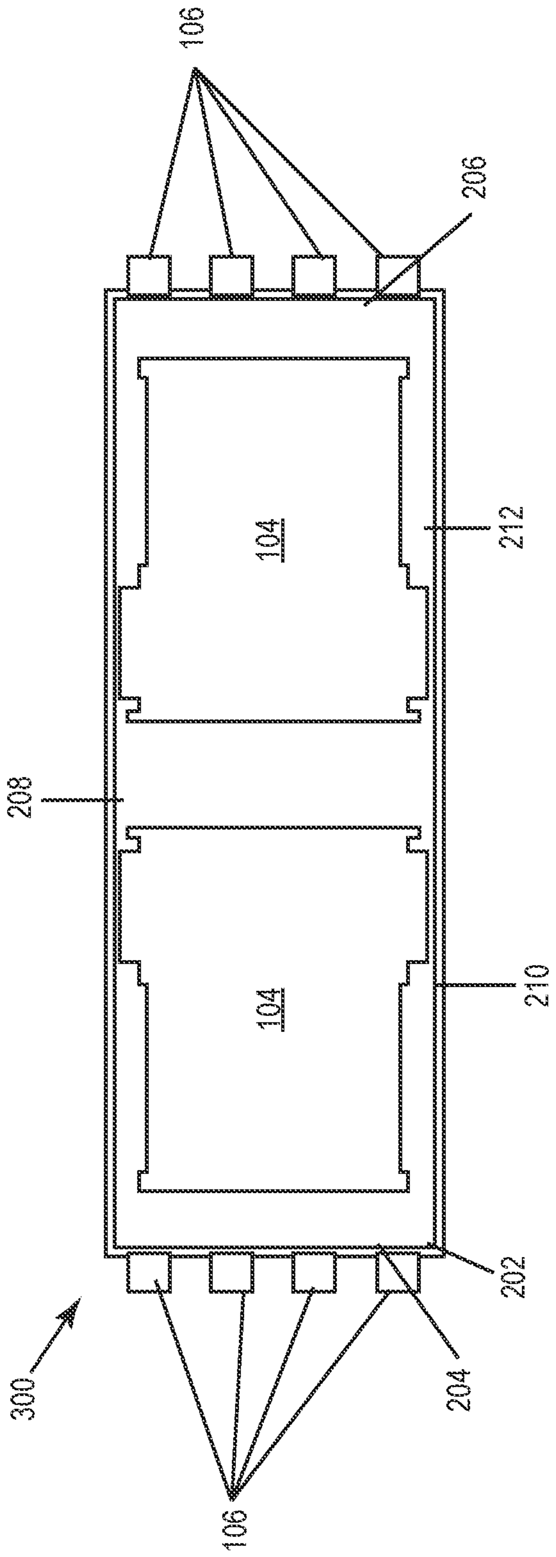
FIG. 4B
FIGURE 4

SEMICONDUCTOR PACKAGE WITH HYBRID INTERCONNECT CLIP

BACKGROUND

Many different applications such as automotive and industrial applications utilize power modules. Power modules can form part of power efficient solutions to reduce or prevent anthropogenic emissions of greenhouse gases. For instance, hybrid electric vehicles (HEVs) or electric vehicles (EVs) utilize power modules to perform power conversion, inversion, switching, etc., in a power efficient manner. Power modules may include multiple discrete switching devices, e.g., MOSFETs, IGBTs, etc. It is desirable to produce power modules with multiple discrete switching at lower cost and higher reliability.

SUMMARY

A method of forming a semiconductor package is disclosed. According to an embodiment, the method comprises providing first and second lead frames, each comprising a die pad and a plurality of contacts that are connected with and vertically offset from the die pad, providing first and second semiconductor dies, each comprising a first terminal disposed on an upper surface and a second terminal disposed on a lower surface, providing a first clip frame that comprises a first die mating pad, a second die mating pad, and a bridge section that extends between the first and second die mating pads; mounting the first semiconductor die on the first lead frame such that the second terminal of the first semiconductor die faces and electrically connects with the die pad of the first lead frame; mounting the second semiconductor die on the second lead frame such that the second terminal of the second semiconductor die faces and electrically connects with the die pad of the second lead frame; and attaching the first clip frame to the first and second semiconductor dies such that the first die mating pad faces and electrically connects with the first terminal of the first semiconductor die and such that the second die mating pad faces and electrically connects with the first terminal of the second semiconductor die.

A semiconductor package is disclosed. According to an embodiment, the semiconductor package comprises first and second lead frames, each comprising a die pad and a plurality of contacts that are connected with and vertically offset from the die pad; first and second semiconductor dies, each comprising a first terminal disposed on an upper surface and a second terminal disposed on a lower surface; and a first clip frame that comprises a first die mating pad, a second die mating pad, and a bridge section that extends between the first and second die mating pads, wherein the first semiconductor die is mounted on the first lead frame such that the second terminal of the first semiconductor die faces and electrically connects with the die pad of the first lead frame, wherein the second semiconductor die is mounted on the second lead frame such that the second terminal of the second semiconductor die faces and electrically connects with the die pad of the second lead frame, and wherein the first clip frame is attached to the first and second semiconductor dies such that the first die mating pad faces and electrically connects with the first terminal of the first semiconductor die and such that the second die mating pad faces and electrically connects with the first terminal of the second semiconductor die.

According to an embodiment, the semiconductor package comprises first and second lead frames, each comprising a die pad and a plurality of contacts that are connected the die pad; first and second semiconductor dies mounted on the die pads of the first and second lead frames, respectively, each of the first and second semiconductor dies being transistor dies; a first clip frame that comprises a first die mating pad, a second die mating pad, and a bridge section that extends between the first and second die mating pads; a package body of electrically insulating encapsulant material that encapsulates the first semiconductor die and the second semiconductor die, wherein the first and second semiconductor dies are arranged as a bidirectional switch that is configured to control current flowing in two directions, wherein the contacts of the first and second lead frames form input-output terminals of the bidirectional switch that are exposed from the package body, wherein the bridge section forms a central terminal of the bidirectional switch that is that is exposed from the package body.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 2A illustrates a side-view of the semiconductor die; FIG. 2B illustrates a plan-view of an upper surface semiconductor die; and FIG. 2C illustrates a plan-view of a lower surface semiconductor die.

FIG. 3, which includes FIGS. 3A-3B, illustrates an assembly used to form a semiconductor package. FIG. 3A illustrates a plan-view of first, second and third clip frames used to form a semiconductor package; and FIG. 3B illustrates a plan-view of the first, second and third clip frames arranged over first and second lead frames.

FIG. 4, which includes FIGS. 4A-4C, illustrates a semiconductor package, according to an embodiment. FIG. 4A illustrates a side-view of the semiconductor package; FIG. 4B illustrates a plan-view of an upper side the semiconductor package; and FIG. 4C illustrates a plan-view of a lower side the semiconductor package.

DETAILED DESCRIPTION

A semiconductor package with an advantageous hybrid interconnect clip and corresponding methods of forming the semiconductor package are described herein. The semiconductor package comprises two semiconductor dies encapsulated within a package body. The semiconductor dies may be discrete power devices, such as power transistor devices. The semiconductor package can have different multi-switching device topologies. In an embodiment, the semiconductor package is configured as a bidirectional switch, wherein the two dies are arranged for bidirectional current flow. By utilizing a molded package design, the semiconductor package can be produced at significantly lower cost than housing-based power modules that utilize expensive power electronics substrates such as DBC (direct bonded copper) or AMB (active metal brazed) substrates. In the package, the semiconductor dies are mounted on two separate lead frames, with contacts of each lead frame extending away from one another and forming package terminals at opposite sides of the package. Additionally, the semiconductor package includes an interconnect clip connected between the semiconductor dies. The interconnect clip has a hybrid configuration whereby it provides electrical interconnect between terminals of the dies and serves as an externally accessible package terminal at a central region of the semiconductor package. The semiconductor package may additionally comprise additional clip frames connected with upper surface terminals of the semiconductor dies (e.g., gate terminals) that include external contact portions that allow for individual control of these terminals.

Figures 1, 1A, 1B:
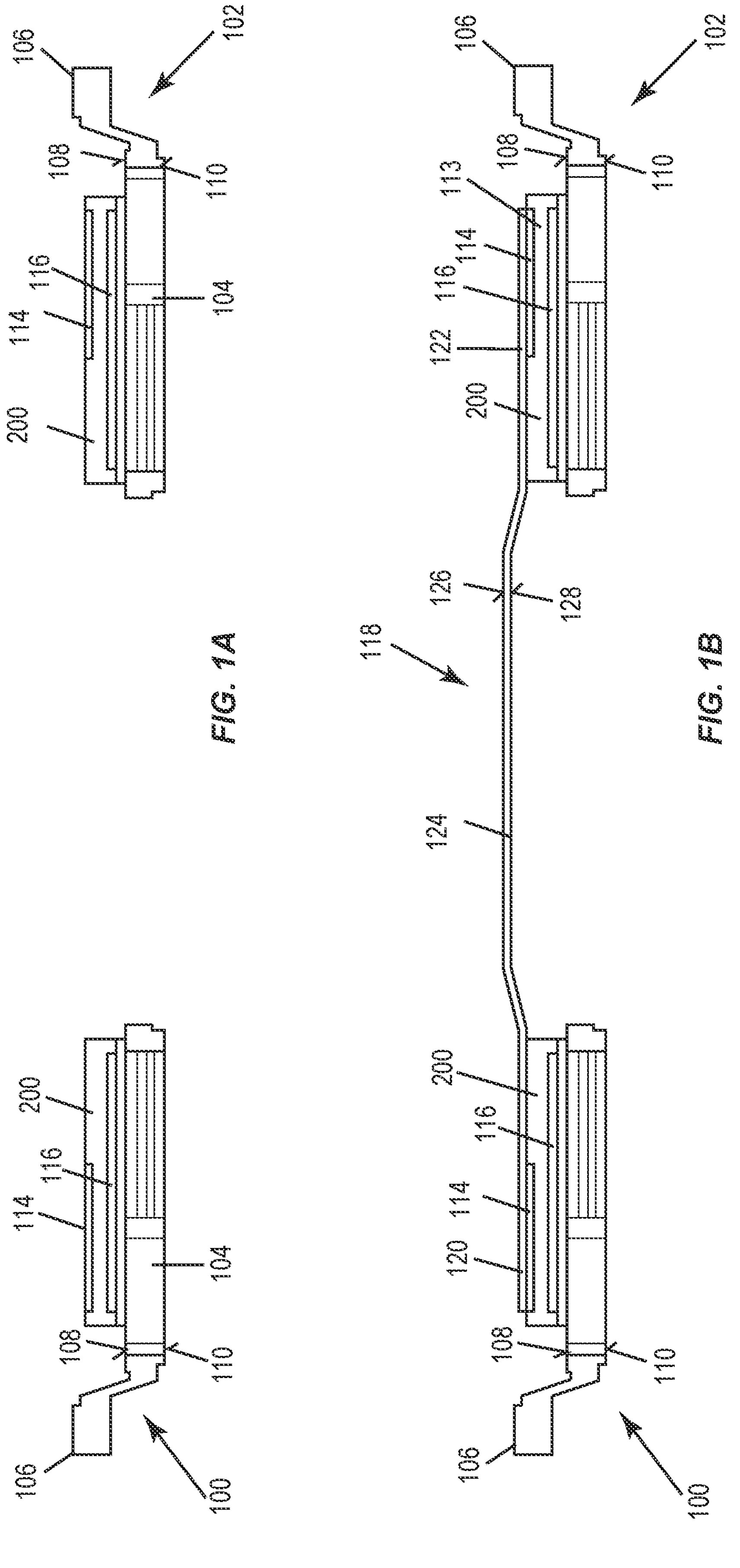
FIG. 1, which includes
FIGS. 1A-1B, illustrates selected method steps in a method of forming a semiconductor package, according to an embodiment.

Referring to FIG. 1A, a method of forming a semiconductor package 300 comprises providing a first and second lead frames 100, 102. The first and second lead frames 100, 102 may be formed from electrically conductive metals such as copper, aluminum, nickel, silver, palladium, gold, etc., and alloys thereof. The first and second lead frames 100, 102 may comprise a core metal region that is formed from one or more of the above-mentioned electrically conductive metals and may optionally comprise one or more coatings formed on the core metal region that improve the surface properties of the lead frame, e.g., protection coatings, adhesion coatings, anti-corrosion coatings, etc. The first and second lead frames 100, 102 may be formed from a uniform thickness sheet of metal that is processed to create the geometry depicted and described herein using metal processing techniques such as stamping, bending, cutting, etching, etc.

Figures 4, 4C:
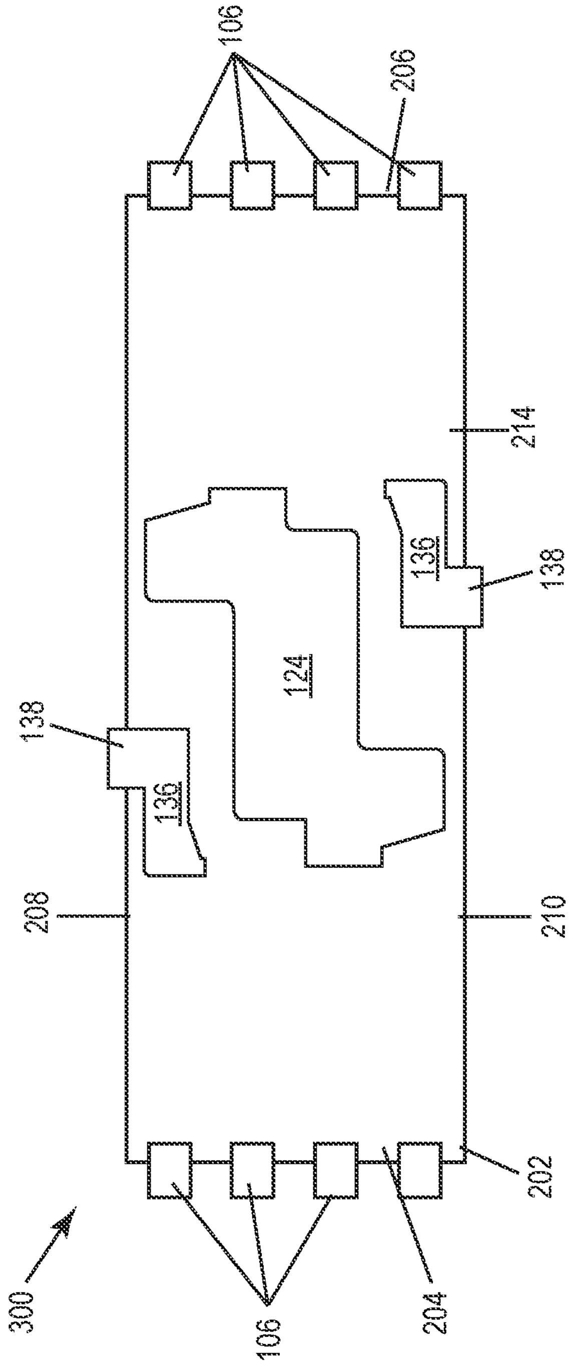

The first and second lead frames 100, 102 each comprise a die pad 104 and a plurality (as seen in FIG. 4) of contacts 106 that are each connected with the die pad 104. The die pad 104 is a planar structure that is sufficiently large to accommodate the mounting of a semiconductor die thereon. The contacts 106 form externally accessible terminals in the completed package. The contacts 106 may form elongated leads that are configured to protrude out from an encapsulant body. Alternatively, the contacts 106 may be arranged as structures that are coplanar or substantially coplanar with an encapsulant body surface, i.e., the contacts of a so-called "no-lead" package. More generally, the completed semiconductor package may have any package type.

According to the depicted embodiment, the contacts 106 of the first and second lead frames 100, 102 are vertically offset from the respective die pads 104 to which they connect with. That is, the upper surface 108 of the first and second lead frames 100, 102 in the die pad 104 extends along a first plane, and the upper surface 108 of the first and second lead frames 100, 102 at the contacts 106 extends along a second plane that is vertically offset from the first plane. Separately or in combination, the lower surface 110 of the first and second lead frames 100, 102 in the die pad 104 may extend along a third plane, and the lower surface 110 of the first and second lead frames 100, 102 at the contacts 106 may extend along a fourth plane that is vertically offset from the third plane. In a lateral region between the die pad 104 and the contacts 106, the first and second lead frames 100, 102 comprise a transitional span that is angled relative to the die pad 104 and the contacts 106.

The method of forming the semiconductor package 300 comprises providing first and second semiconductor dies 200. The first and second semiconductor dies 200 each comprise a first terminal 114 disposed on an upper surface and a second terminal 116 disposed on a lower surface of the respective die. The first and second terminals 114, 116 may correspond to the load terminals of the device. Additional details and potential configurations of the first and second semiconductor dies 200 are described in further detail below with reference to FIG. 2.

The method of forming a semiconductor package 300 comprises mounting the first semiconductor die 200 on the first lead frame 100 and mounting the second semiconductor die 200 on the second lead frame 102. The first semiconductor die 200 is mounted such that the second terminal 116 of the first semiconductor die 200 faces and electrically connects with the die pad 104 of the first lead frame 100. Likewise, the second semiconductor die 200 is mounted on the second lead frame 102 such that the second terminal 116 of the second semiconductor die 200 faces and electrically connects with the die pad 104 of the second lead frame 102. As a result, the contacts 106 of the first and second lead frames 100, 102 form package terminals connected with the second terminals 116 of the first and second semiconductor dies 200.

Generally speaking, the first and second semiconductor dies 200 may be mounted on the die pads 104 using any kind of electrically conductive attachment technique, e.g., solder, sinter, conductive glue, etc. According to an embodiment, at least one of the mounting of the first semiconductor die 200 on the first lead frame 100 and the mounting of the second semiconductor die 200 on the second lead frame 102 comprises a diffusion soldering technique. Diffusion soldering refers to a technique whereby a very thin, e.g., less than or equal to 50 μm, 40 μm, 30 μm, etc., layer of solder material is provided in between two metal joining partners, and the soldering process causes metal atoms from the joining partners to diffuse into the thin layer solder material, thereby creating a soldered joint with intermetallic phases. These intermetallic phases have a higher melting temperature than the solder temperature of the diffusion soldering process and create a stable mechanical bond. Examples of diffusion soldering techniques are described in U.S. Pat. Nos. 11,605,608, 11,610,861, and 11,764,185, the content of each document being incorporated by reference herein in their entirety.

Referring to FIG. 1B, a method of forming the semiconductor package 300 comprises providing a first clip frame 118. The first clip frame 118 may be formed from electrically conductive metals such as copper, aluminum, nickel, silver, palladium, gold, etc., and alloys thereof. The first clip frame 118 may comprise a core metal region that is formed from one or more of the above-mentioned electrically conductive metals and may optionally comprise one or more coatings formed on the core metal region that improve the surface properties of the lead frame, e.g., protection coatings, adhesion coatings, anti-corrosion coatings, etc. The first clip frame 118 may be formed from a uniform thickness sheet of metal that is processed to create the geometry depicted and described herein using metal processing techniques such as stamping, bending, cutting, etching, etc.

The first clip frame 118 comprises a first die mating pad 120, a second die mating pad 122, and a bridge section 124 that extends between the first and second die mating pads 120, 122. The first and second die mating pads 120, 122 are lateral spans of metal that are configured to be attached with an upper surface terminal of a semiconductor die and form an electrical connection thereto. Thus, the first and second die mating pads 120, 122 may have a generally planar geometry. As will be described in further detail below, the plan-view geometry of the first and second die mating pads 120, 122 may be adapted to a particular terminal profile of the semiconductor die to which they mate with. The bridge section 124 is a span of metal that connects with the first and second die mating pads 120, 122 and therefore completes an electrical connection between them.

According to an embodiment, the bridge section 124 is vertically offset from the first and second die mating pads 120, 122. That is, the bridge section 124 extends along different vertical planes as the first and second die mating pads 120, 122. As shown, the upper surface 126 of the first clip frame 118 in the bridge section 124 extends along a first plane, and the upper surface 126 of the first clip frame 118 at the first and second die mating pads 120, 122 extends along a second plane that is vertically offset from the first plane. Likewise, the lower surface 128 of the first clip frame 118 in the bridge section 124 extends along a third plane, and the lower surface 128 of the first clip frame 118 at the first and second die mating pads 120, 122 extends along a fourth plane that is vertically offset from the third plane.

The method of forming the semiconductor package 300 comprises attaching the first clip frame 118 to the first and second semiconductor dies 200. The first clip frame 118 is attached such that the first die mating pad 120 faces and electrically connects with the first terminal 114 of the first semiconductor die 200 and such that the second die mating pad 122 faces and electrically connects with the first terminal 114 of the second semiconductor die 200. Generally speaking, the attachment of the first clip frame 118 to the first and second semiconductor dies 200 may comprise any kind of electrically conductive attachment technique, e.g., solder, sinter, conductive glue, etc, and may include the same technique used to mount the first semiconductor die 200 on the first lead frame 100 and/or mount the second semiconductor die 200 on the second lead frame 102. According to an embodiment, attaching the first clip frame 118 to the first and second semiconductor dies 200 comprises diffusion soldering. For example, the attachment of the first clip frame 118 to the first and second semiconductor dies 200 may comprise the same diffusion soldering technique and/or may share at least some processing steps and/or solder material in common with the technique used to mount the first semiconductor die 200 on the first lead frame 100 and/or mount the second semiconductor die 200 on the second lead frame 102.

After the clip frame is attached to the 118 to the first and second semiconductor dies 200, the upper surface 126 of the first clip frame 118 in the bridge section 124 may be vertically aligned with the upper surface 108 of the first and second lead frames 100, 102 at the contacts 106. In this way, the first clip frame 118 and the contacts 106 together form a singular contact surface that can be made coplanar with a package body, as will be discussed below. The vertical alignment of the upper surface 126 of the first clip frame 118 in the bridge section 124 with the upper surface 108 of the first and second lead frames 100, 102 at the contacts 106 may be realized through appropriate selection of the vertical offsets of the first and second lead frames 100, 102 and the first clip frame 118, while accounting for the thickness of the first and second semiconductor dies 200.

Figures 2, 2A, 2B, 2C:
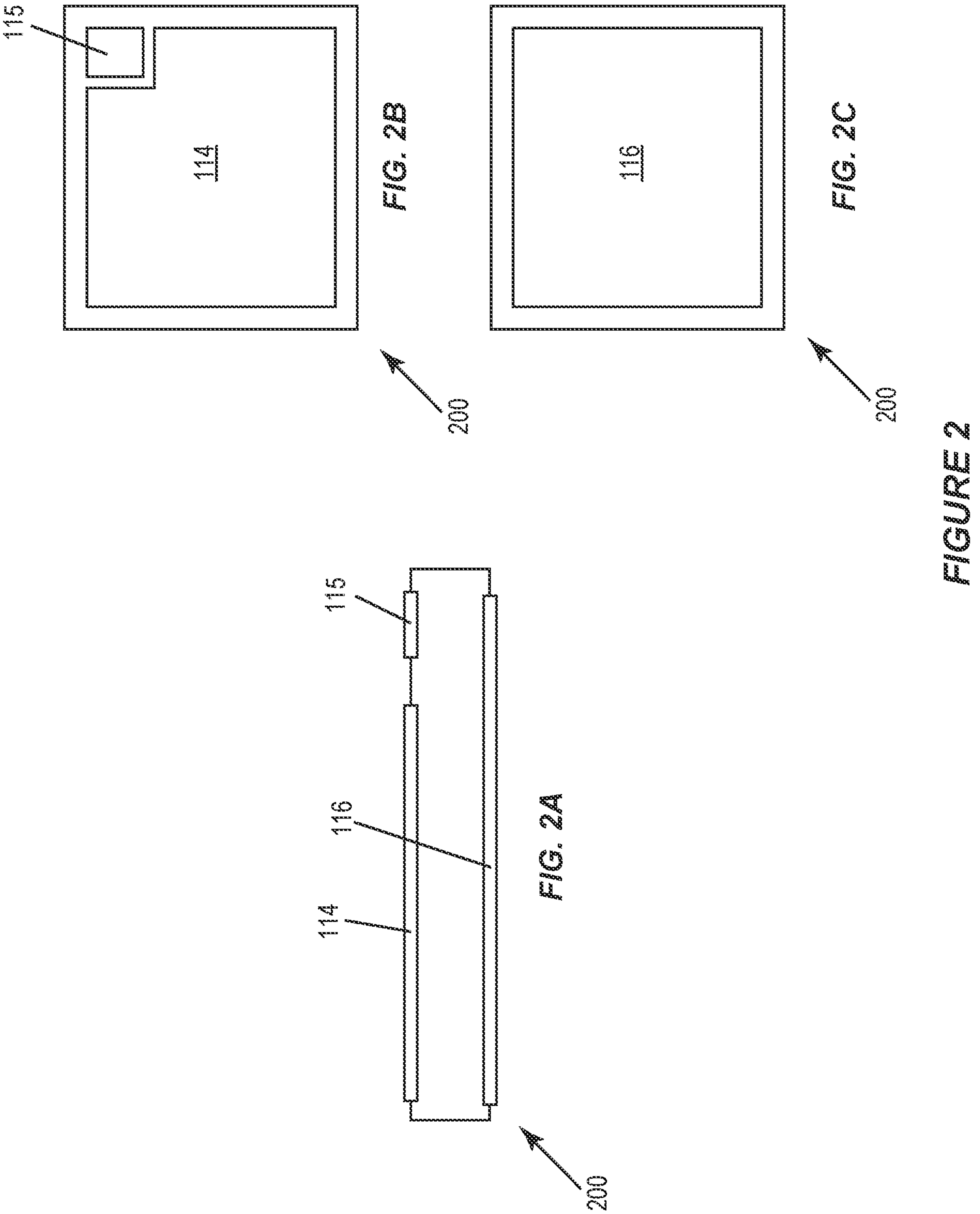
FIG. 2, which includes
FIGS. 2A-2C, illustrates a semiconductor die, according to an embodiment.

Referring to FIG. 2, a semiconductor die 200 is shown, according to an embodiment. The semiconductor die 200 may be used as the first semiconductor die 200 mounted on the first lead frame 100 and the second semiconductor die 200 mounted on the second lead frame 102. In an embodiment, the two semiconductor dies 200 may have an identical configuration. Alternatively, the first semiconductor die 200 mounted on the first lead frame 100 may differ from second semiconductor die 200 mounted on the second lead frame 102 in at least some aspects, e.g., terminal arrangement, device principle, etc.

The semiconductor die 200 comprises a first terminal 114 disposed on an upper surface 108 and a second terminal 116 disposed on a lower surface. As mentioned above, the first and second terminals 114, 116 may correspond to the load terminals of the device, i.e., the terminals that conduct a load current in an on-state of the device and maintain a load voltage in an off-state of the device. As shown, the semiconductor die 200 additionally comprises a third terminal 115 disposed on the upper surface of the semiconductor die 200. The third terminal 115 may be a gate terminal that is configured to control a conductive connection between the first and second terminals 114, 116.

According to an embodiment, the semiconductor die 200 is configured as a power transistor. Examples of power transistors include MOSFETs, IGBTs and HEMTs. In these devices, the first and second terminals 114, 116 may respectively correspond to the source and drain terminals (or vice-versa) in the case of a MOSFET or HEMT and may respectively correspond to the emitter and collector terminals (or vice-versa) in the case of an IGBT. In each case, the third terminal 115 is a gate terminal that controls a conductive connection between the first and second terminals 114, 116 in a commonly known manner.

According to an embodiment, the semiconductor die 200 is configured as a vertical device. That is, the semiconductor die 200 is configured with active regions disposed on opposite sides of the semiconductor die, wherein the operational current flows between these active regions in a direction perpendicular to the main and rear surfaces of the semiconductor die. Alternatively, the semiconductor die 200 may be configured as a lateral device wherein the operational current flows between active regions disposed on the same main surface of the die. In that case, a connection with the second terminal 116 disposed on the rear surface of the die may be realized by an internal through-via.

According to an embodiment, the semiconductor die 200 is configured as a silicon carbide (SiC) device. A silicon carbide device refers to a device that utilizes silicon carbide as the substrate material to form the active device regions therein. For example, the semiconductor die 200 may be configured as an SiC vertical power MOSFET, wherein the first and second terminals 114, 116 correspond to the source and drain terminals of the device, respectively.

According to an embodiment, the semiconductor die 200 is configured as a III-V semiconductor device. A III-V semiconductor device refers to a device that utilizes III-V semiconductor material e.g., gallium nitride (GaN), gallium arsenide (GaAs), aluminium gallium nitride (AlGaN), indium gallium nitride (INGaN), etc, as the main substrate material to form the active device regions therein. Examples of III-V semiconductor devices include HEMT (high-electron mobility transistor) devices wherein the device channel is created by heterojunctions of different bandgap III-V semiconductor material. For example, the semiconductor die 200 may be configured as a gallium nitride device. More particularly, the semiconductor die 200 may be configured as a GaN based HEMT device, wherein the first and second terminals 114, 116 correspond to the source and drain terminals of the device, respectively. Such a device may have a lateral device configuration wherein the second terminal 116 is connected by a vertical through-via. Alternatively, such as a device may have a vertical device configuration.

Referring to FIG. 3A, a method of forming a semiconductor package 300 comprises providing a first clip frame 118, a second clip frame 130 and a third clip frame 132. The first clip frame 118, the second clip frame 130 and the third clip frame 132 may be formed from conductive metals such as copper, aluminum, nickel, silver, palladium, gold, etc., and alloys thereof. The first clip frame 118, the second clip frame 130 and the third clip frame 132 may be formed from the same materials and/or using the same processing techniques. In an embodiment, the first clip frame 118, the second clip frame 130 and the third clip frame 132 are each formed from a commonly sheet of metal that is processed and severed from a peripheral structure, e.g., in a similar manner as a lead frame construction. The assembly comprising the first clip frame 118, the second clip frame 130 and the third clip frame 132 can be used in combination with the semiconductor die 200 having the three terminal configuration shown in FIG. 2. The first clip frame 118 in the depicted embodiment includes a bridge section 124 with a meandering arrangement and indentations that accommodate features of the second clip frame 130 and a third clip frame 132 in a space-efficient manner. Each of the second and third clip frames 130, 132 comprise a die mating pad 134 and an external contact portion 136 attached to the respective die mating pad 134. The die mating pads 134 are lateral spans of metal that are configured to be attached with an upper surface terminal of a semiconductor die and form an electrical connection thereto. The external contact portions 136 are spans of metal with one or more contact surfaces that can be externally contacted in the completed package. In the depicted embodiment, the external contact portions 136 of the second clip and third clip frames 130 comprise protruding contacts 138 that are configured to protrude out from an encapsulant body and form external package terminals in the completed package. From a side-view perspective, the second clip frame 130 and the third clip frame 132 may each be arranged such that the die mating pads 134 of the second clip frame 130 and the third clip frame 132 are vertically offset from the span comprising the external contact portion 136 in a similar manner as described above with reference to the first clip frame 118 and shown in FIG. 1.

Referring to FIG. 3B, an assembly comprising first clip frame 118, a second clip frame 130 and a third clip frame 132 together with the first and second lead frames 100, 102 is shown. In this assembly, the first one of the semiconductor dies 200 (not visible in FIG. 3A) may be arranged between the die pad 104 from the first lead frame 100 and the first die mating pad 120 of the first clip frame 118 and the second one of the semiconductor dies 200 (not visible in FIG. 3A) may be arranged between the die pad 104 from the second lead frame 102 and the second die mating pad 122 of the first clip frame 118. Additionally, the second clip frame 130 is attached to the first semiconductor die 200 mounted on the first lead frame 100 such that the die mating pad 134 of the second clip frame 130 faces and electrically connects with the third terminal 115 of the first semiconductor die 200, and the third clip frame 132 is attached to the second semiconductor die 200 mounted on the second lead frame 102 such that the die mating pad 134 of the third clip frame 132 faces and electrically connects with the third terminal 115 of the second semiconductor die 200. This attachment and electrical connection of the die mating pads 134 of the first and second clip frames 130, 132 may be done using any of the techniques described above, e.g., soldering, sintering, etc. This attachment and electrical connection may comprise the same diffusion soldering technique and/or may share at least some processing steps and/or solder material in common with the above-mentioned diffusion soldering steps formed in connection with the mounting of the semiconductor dies 200 and/or attachment of the first clip frame 118.

Referring to FIG. 4, a method of forming the semiconductor package 300 comprises forming a package body 202 of electrically insulating encapsulant material that encapsulates the first semiconductor die 200 mounted on the first lead frame 100 and the second semiconductor die 200 mounted on the second lead frame 102. According to an embodiment, the package body 202 is formed by a molding process, e.g., injection molding, compression molding, transfer molding, etc. The electrically insulating encapsulant material used to form the package body 202 may be a plastic material formed from an organic resin such as an epoxy resin. The encapsulant may include fillers such as non-melting inorganic materials. Catalysts may be used to accelerate the cure reaction of the organic resin. Other materials such as flame retardants, adhesion promoters, ion traps, stress relievers, colorants, etc. may be added to the encapsulant, as appropriate.

The formed package body 202 comprises first, second, third and fourth edge sides 204, 206, 208, 210. The first, second, third and fourth edge sides 204, 206, 208, 210 form sidewall surfaces of the package body 202 that each vertically extend between a lower side 212 of the package body 202 and an upper side 214 of the package body 202. The second edge side 206 is opposite from the first edge side 204. The third and fourth edge sides 208, 210 are arranged opposite one another and each extend between the first and second edge sides 204, 206.

In the depicted embodiment, the contacts 106 from the first lead frame 100 are exposed at the first edge side 204 of the package body 202, and the contacts 106 from the second lead frame 102 are exposed at the second edge side 206 of the package body 202. Accordingly, the external connections with the first terminals 114 of the two semiconductor dies 200 are arranged at opposite ends of the semiconductor package 300.

In the depicted embodiment, the bridge section 124 is exposed from the lower side 212 of the package body 202 in a central region of the package body 202 that is in between the first and second edge sides 204, 206 of the package body 202. Accordingly, the interconnected second terminals 116 of the two semiconductor dies 200 are electrically accessible at the lower side 212 of the package body 202.

According to an embodiment, the surfaces of the contacts from the first and second lead frames 100, 102 and the bridge section 124 are each substantially coplanar with the lower side of the package body. This provides a so-called surface mount device (SMD) arrangement, wherein the semiconductor package 300 can be mounted directly on a carrier, such as a PCB, and the lower facing package terminals can be electrically connected, e.g., by solder connections.

In the depicted embodiment, the external contact portions 136 of the second and third clip frames 130, 132 are each exposed at the central region of the package body 202 that is in between the first and second edge sides 204, 206 of the package body 202. Accordingly, the third terminals 115 of the two semiconductor dies 200 are electrically accessible at the lower side 212 of the package body 202. The external contact portions 136 of the second and third clip frames 130, 132 may comprise surfaces that are substantially coplanar with the lower side of the package body 202, thereby maintaining the-called surface mount device (SMD) arrangement described above.

In the depicted embodiment, the protruding contact 138 from the second clip frame 130 protrudes out from the third edge side 208 and the protruding contact 138 from the third clip frame 132 protrudes out from the fourth edge side 210. In this way, the third terminals 115 of the two semiconductor dies 200 are electrically accessible at different locations. This provides greater flexibility and allows for different types of electrical interconnections such as bond wires to be effectuated with the external contact portions 136 of the second and third clip frames 130, 132. In various embodiments, the protruding contacts 138 may be omitted or may be used to supplant the surfaces that are substantially coplanar with the lower side of the package body. As shown, the completed semiconductor package 300 includes only one of the protruding contacts 138 for each of the second and third clip frames 130, 132. A lead trimming step may be performed to eliminate some of the structures forming the protruding contacts 138 shown in FIG. 3.

As shown from the plan-view perspective of FIG. 4B, the semiconductor package 300 may be configured such that the die pads 104 from the first and second lead frames 100, 102 are exposed at the upper side 214 of the package body 202. In this way, the die pads 104 may be configured as heat dissipation elements that may be mated with an external heat sink, thereby providing efficient cooling of the first and second semiconductor dies 200 mounted on the first and second lead frames 100, 102.

According to an embodiment, the semiconductor package 300 is configured as a bidirectional switch. In particular, the first and second semiconductor dies 200 mounted on the first and second lead frames 100, 102, respectively are as series connected switching devices that are configured to control current flowing in two directions. In this arrangement, the contacts 106 of the first and second lead frames 100, 102 form input-output terminals of the bidirectional switch. That is, depending on the control states of the first and second semiconductor dies 200, the semiconductor package 300 can be configured to control current flowing in a first direction from the contacts 106 of the first lead frame 100 to the contacts 106 of the second lead frame 102, and in a second, opposite direction, from the contacts 106 of the second lead frame 102 to the contacts 106 of the first lead frame 100. In one example, the first and second semiconductor dies 200 may be configured as MOSFET devices, wherein the first clip frame connects source terminals of the first and second transistor dies together. In such an arrangement, the intrinsic body diodes of the MOSFET devices are arranged in an anti-serial arrangement, thereby allowing for bidirectional current flow wherein a reverse conduction current flows through one of the two semiconductor dies 200.

In an embodiment wherein the semiconductor package 300 is configured as a bidirectional switch, the bridge section forms 124 a central terminal of the bidirectional switch that is that is exposed from the package body 202. The central terminal of the bidirectional switch refers to the node connected between the two switching devices. In a bidirectional switch arrangement, it may be advantageous to electrically access this central terminal to provide a proper control signal (e.g., gate-source bias) to both switching devices. Moreover, the external contact portions 136 of the second and third clip frames 130, 132 form control terminals of the bidirectional switch. In this way, independent control of both switching devices is possible.

Alternatively, the semiconductor package 300 may have other circuit configurations wherein the first and second semiconductor dies 200 mounted on the first and second lead frames 100, 102 are implemented as switching devices. For example, the semiconductor package 300 may arrange the first and second semiconductor dies 200 mounted on the first and second lead frames 100, 102 in a half-bridge connection, wherein the first clip frame 118 forms an electrical connection between different terminals (e.g., source to drain). In that case, first and second semiconductor dies 200 mounted on the first and second lead frames 100, 102 may differ from one another and/or may be mounted asymmetrically to obtain the necessary terminal connections.

Embodiments of a semiconductor package described herein comprise semiconductor dies incorporated into the package. These semiconductor dies may be singulated from a semiconductor wafer (not shown), e.g. by sawing, prior to package production. In general, the semiconductor wafer and therefore the resulting semiconductor die may be made of any semiconductor material suitable for manufacturing a semiconductor device. Examples of such materials include, but are not limited to, elementary semiconductor materials such as silicon (Si) or germanium (Ge), group IV compound semiconductor materials such as silicon carbide (SIC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AllnN), indium gallium nitride (InGaN), aluminum gallium indium nitride (AlGalnN) or indium gallium arsenide phosphide (InGaAsP), etc.

The semiconductor dies disclosed herein can have any of a variety of device configurations. Examples of these devices include power semiconductor devices, such as power MISFETs (Metal Insulator Semiconductor Field Effect Transistors) power MOSFETs (Metal Oxide Semiconductor Field Effect Transistors), IGBTs (Insulated Gate Bipolar Transistors), JFETs (Junction Gate Field Effect Transistors), HEMTs (High Electron Mobility Transistors), power bipolar transistors or power diodes such as, e.g., PIN diodes or Schottky diodes, etc. One or more of the semiconductor dies can be configured as a so-called lateral device. In this configuration, the terminals of the semiconductor die are provided on a single main surface and the semiconductor die is configured to conduct in a direction that is parallel to the main surface of the semiconductor die. Alternatively, one or more of the semiconductor dies can be configured as a so-called vertical device. In this configuration, the terminals of the semiconductor die are provided on opposite facing main and rear surface and the semiconductor die is configured to conduct in a direction that is perpendicular to the main surface of the semiconductor die.

The semiconductor dies disclosed herein may be configured as power devices. The term power device refers to a discrete semiconductor die that is rated to accommodate voltages and/or currents associated with power applications, e.g., voltages of at least 100 V (volts), at least 600 V, at least 1200V or more and/or rated to accommodate currents of at least 1 A (amperes), at least 10 A, at least 50 A, at least 100 A or more. Power devices include power transistors, e.g., MOSFETs, HEMTs, IGBTs, etc., thyristors and diodes.

A variety of different package types exist within the semiconductor industry. Examples of these package types include the so-called TO (transistor outline) package type, the DIP (dual in-line package), LGA (land grid array) package type, MCM (multi-chip module) package type, LCC (leaded chip carrier) package type, PGA (pin grid array) package type, CFP (ceramic flat pack) package type, QFN (quad flat no-leads) package type, TSOP (thin small-outline package) package type and WLB (Wafer Level Ball Grid Array) package type. The term "package type" refers to the particular construction of a semiconductor package, in particular the arrangement and structure of the external contacts, the arrangement and structure of the carrier structure that accommodates the semiconductor dies, and the arrangement and structure of the encapsulant material.

The term "substantially" as used herein describes a nominal relationship between elements to the extent practically achievable and/or necessary for a given application. The "substantially" encompasses deviation from a nominal or target value that may result from processing tolerances or other factors tending to cause deviation from the nominal or target value.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

Although the present disclosure is not so limited, the following numbered examples demonstrate one or more aspects of the disclosure.

Example 1

A method of forming a semiconductor package, the method comprising: providing first and second lead frames, each comprising a die pad and a plurality of contacts that are connected with and vertically offset from the die pad; providing first and second semiconductor dies, each comprising a first terminal disposed on an upper surface and a second terminal disposed on a lower surface; providing a first clip frame that comprises a first die mating pad, a second die mating pad, and a bridge section that extends between the first and second die mating pads; mounting the first semiconductor die on the first lead frame such that the second terminal of the first semiconductor die faces and electrically connects with the die pad of the first lead frame; mounting the second semiconductor die on the second lead frame such that the second terminal of the second semiconductor die faces and electrically connects with the die pad of the second lead frame; and attaching the first clip frame to the first and second semiconductor dies such that the first die mating pad faces and electrically connects with the first terminal of the first semiconductor die and such that the second die mating pad faces and electrically connects with the first terminal of the second semiconductor die.

Example 2

The method of example 1, further comprising forming a package body of electrically insulating encapsulant material that encapsulates the first semiconductor die and the second semiconductor die, and wherein after forming the package body the contacts from the first lead frame are exposed at a first edge side of the package body, the contacts from the second lead frame are exposed at a second edge side of the package body that is opposite from the first edge side of the package body, and the bridge section is exposed at a central region of the package body that is in between the first and second edge sides of the package body.

Example 3

The method of example 2, wherein after forming the package body, lower surfaces of the contacts from the first and second lead frames and the bridge section are each substantially coplanar with a lower side of the package body.

Example 4

The method of example 2, wherein the first and second semiconductor dies each comprise a third terminal disposed on the upper surface of the respective die, and wherein the method further comprises: providing second and third clip frames, each comprising a die mating pad and an external contact portion attached to the die mating pad; attaching the second clip frame to the first semiconductor die such that the die mating pad of the second clip frame faces and electrically connects with the third terminal of the first semiconductor die; and attaching the third clip frame to the second semiconductor die such that the die mating pad of the third clip frame faces and electrically connects with the third terminal of the second semiconductor die, wherein after forming the package body the external contact portions of the second and third clip frames are each exposed at the central region of the package body that is in between the first and second edge sides of the package body.

Example 5

The method of example 4, wherein the package body comprises third and fourth edge sides that are arranged opposite one another and each extend between the first and second edge sides, wherein the external contact portions of the second and third clip frames comprise a protruding contact, and wherein after forming the package body, the protruding contact from the second clip frame protrudes out from the third edge side and the protruding contact from the third clip frame protrudes out from the fourth edge side.

Example 6

The method of example 5, wherein the first and second semiconductor dies are each configured as vertical power transistor dies, wherein the first and second terminals of the first and second semiconductor dies are load terminals, and wherein the third terminals of the first and second semiconductor dies are gate terminals.

Example 7

The method of example 6, wherein the first and second semiconductor dies are arranged as a bidirectional switch that is configured to control current flowing in two directions, wherein the contacts of the first and second lead frames form input-output terminals of the bidirectional switch that are exposed from the package body, wherein the bridge section forms a central terminal of the bidirectional switch that is that is exposed from the package body, and wherein the external contact portions of the second and third clip frames form control terminals of the bidirectional switch.

Example 8

The method of example 1, wherein at least one of: mounting the first semiconductor die on the first lead frame, mounting the second semiconductor die on the second lead frame, and attaching the first clip frame to the first and second semiconductor dies comprises diffusion soldering.

Example 9

The method of example 1, wherein the first and second semiconductor dies are each silicon carbide devices.

Example 10

The method of example 1, wherein the first and second semiconductor dies are each gallium nitride devices.

Example 11

A semiconductor package, comprising: first and second lead frames, each comprising a die pad and a plurality of contacts that are connected with and vertically offset from the die pad; first and second semiconductor dies, each comprising a first terminal disposed on an upper surface and a second terminal disposed on a lower surface; and a first clip frame that comprises a first die mating pad, a second die mating pad, and a bridge section that extends between the first and second die mating pads; wherein the first semiconductor die is mounted on the first lead frame such that the second terminal of the first semiconductor die faces and electrically connects with the die pad of the first lead frame; wherein the second semiconductor die is mounted on the second lead frame such that the second terminal of the second semiconductor die faces and electrically connects with the die pad of the second lead frame, and wherein the first clip frame is attached to the first and second semiconductor dies such that the first die mating pad faces and electrically connects with the first terminal of the first semiconductor die and such that the second die mating pad faces and electrically connects with the first terminal of the second semiconductor die.

Example 12

The semiconductor package of example 11, further comprising a package body of electrically insulating encapsulant material that encapsulates the first semiconductor die and the second semiconductor die, and wherein the contacts from the first lead frame are exposed at a first edge side of the package body, the contacts from the second lead frame are exposed at a second edge side of the package body that is opposite from the first edge side of the package body, and the bridge section is exposed at a central region of the package body that is in between the first and second edge sides of the package body.

Example 13

The semiconductor package of example 12, wherein lower surfaces of the contacts from the first and second lead frames and the bridge section are each substantially coplanar with a lower side of the package body.

Example 14

The semiconductor package of example 12, wherein the first and second semiconductor dies each comprise a third terminal disposed on the upper surface of the respective die, and wherein the semiconductor package further comprises second and third clip frames, each comprising a die mating pad and an external contact portion attached to the die mating pad, wherein the second clip frame is attached to the first semiconductor die such that the die mating pad of the second clip frame faces and electrically connects with the third terminal of the first semiconductor die, wherein the third clip frame is attached to the second semiconductor die such that the die mating pad of the third clip frame faces and electrically connects with the third terminal of the second semiconductor die, and wherein the external contact portions of the second and third clip frames are each exposed at the central region of the package body that is in between the first and second edge sides of the package body.

Example 15

The semiconductor package of example 14, wherein the package body comprises third and fourth edge sides that are arranged opposite one another and each extend between the first and second edge sides, wherein the external contact portions of the second and third clip frames comprise a protruding contact, and wherein the protruding contact from the second clip frame protrudes out from the third edge side and the protruding contact from the third clip frame protrudes out from the fourth edge side.

Example 16

The semiconductor package of example 11, wherein the first and second semiconductor dies are each silicon carbide devices.

Example 17

The semiconductor package of example 11, wherein the first and second semiconductor dies are each gallium nitride devices.

Example 18

A semiconductor package, comprising: first and second lead frames, each comprising a die pad and a plurality of contacts that are connected the die pad; first and second semiconductor dies mounted on the die pads of the first and second lead frames, respectively, each of the first and second semiconductor dies being transistor dies; a first clip frame that comprises a first die mating pad, a second die mating pad, and a bridge section that extends between the first and second die mating pads; and a package body of electrically insulating encapsulant material that encapsulates the first semiconductor die and the second semiconductor die, wherein the first and second semiconductor dies are arranged as a bidirectional switch that is configured to control current flowing in two directions, wherein the contacts of the first and second lead frames form input-output terminals of the bidirectional switch that are exposed from the package body, and wherein the bridge section forms a central terminal of the bidirectional switch that is that is exposed from the package body.

Example 19

The semiconductor package of example 17, wherein the contacts from the first lead frame are exposed at a first edge side of the package body, wherein the contacts from the second lead frame are exposed at a second edge side of the package body that is opposite from the first edge side of the package body, and wherein the bridge section is exposed at a central region of the package body that is in between the first and second edge sides of the package body.

Example 20

The semiconductor package of example 19, further comprising second and third clip frames that are connected with gate terminals of the first and second semiconductor dies, respectively, and wherein the second and third clip frames comprise external contact portions that are exposed at the central region of the package body.

Example 21

The semiconductor package of example 20, wherein the first and second semiconductor dies are configured as MOSFET devices, and wherein the first clip frame connects source terminals of the first and second semiconductor dies together.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of forming a semiconductor package, the method comprising:

providing first and second lead frames, each comprising a die pad and a plurality of contacts that are connected with and vertically offset from the die pad;

providing first and second semiconductor dies, each comprising a first terminal disposed on an upper surface and a second terminal disposed on a lower surface;

providing a first clip frame that comprises a first die mating pad, a second die mating pad, and a bridge section that extends between the first and second die mating pads;

mounting the first semiconductor die on the first lead frame such that the second terminal of the first semiconductor die faces and electrically connects with the die pad of the first lead frame;

mounting the second semiconductor die on the second lead frame such that the second terminal of the second semiconductor die faces and electrically connects with the die pad of the second lead frame; and attaching the first clip frame to the first and second semiconductor dies such that the first die mating pad faces and electrically connects with the first terminal of the first semiconductor die and such that the second die mating pad faces and electrically connects with the first terminal of the second semiconductor die.

2. The method of claim 1, further comprising forming a package body of electrically insulating encapsulant material that encapsulates the first semiconductor die and the second semiconductor die, and wherein after forming the package body the contacts from the first lead frame are exposed at a first edge side of the package body, the contacts from the second lead frame are exposed at a second edge side of the package body that is opposite from the first edge side of the package body, and the bridge section is exposed at a central region of the package body that is in between the first and second edge sides of the package body.

3. The method of claim 2, wherein after forming the package body, lower surfaces of the contacts from the first and second lead frames and the bridge section are each substantially coplanar with a lower side of the package body.

4. The method of claim 2, wherein the first and second semiconductor dies each comprise a third terminal disposed on the upper surface of the respective die, and wherein the method further comprises:

providing second and third clip frames, each comprising a die mating pad and an external contact portion attached to the die mating pad;

attaching the second clip frame to the first semiconductor die such that the die mating pad of the second clip frame faces and electrically connects with the third terminal of the first semiconductor die; and attaching the third clip frame to the second semiconductor die such that the die mating pad of the third clip frame faces and electrically connects with the third terminal of the second semiconductor die, wherein after forming the package body the external contact portions of the second and third clip frames are each exposed at the central region of the package body that is in between the first and second edge sides of the package body.

5. The method of claim 4, wherein the package body comprises third and fourth edge sides that are arranged opposite one another and each extend between the first and second edge sides, wherein the external contact portions of the second and third clip frames comprise a protruding contact, and wherein after forming the package body, the protruding contact from the second clip frame protrudes out from the third edge side and the protruding contact from the third clip frame protrudes out from the fourth edge side.

6. The method of claim 5, wherein the first and second semiconductor dies are each configured as vertical power transistor dies, wherein the first and second terminals of the first and second semiconductor dies are load terminals, and wherein the third terminals of the first and second semiconductor dies are gate terminals.

7. The method of claim 6, wherein the first and second semiconductor dies are arranged as a bidirectional switch that is configured to control current flowing in two directions, wherein the contacts of the first and second lead frames form input-output terminals of the bidirectional switch that are exposed from the package body, wherein the bridge section forms a central terminal of the bidirectional switch that is exposed from the package body, and wherein the external contact portions of the second and third clip frames form control terminals of the bidirectional switch.

8. The method of claim 1, wherein at least one of: mounting the first semiconductor die on the first lead frame, mounting the second semiconductor die on the second lead frame, and attaching the first clip frame to the first and second semiconductor dies comprises diffusion soldering.

9. The method of claim 1, wherein the first and second semiconductor dies are each silicon carbide devices.

10. The method of claim 1, wherein the first and second semiconductor dies are each gallium nitride devices.

11. A semiconductor package, comprising:

first and second lead frames, each comprising a die pad and a plurality of contacts that are connected with and vertically offset from the die pad;

first and second semiconductor dies, each comprising a first terminal disposed on an upper surface and a second terminal disposed on a lower surface; and a first clip frame that comprises a first die mating pad, a second die mating pad, and a bridge section that extends between the first and second die mating pads;

wherein the first semiconductor die is mounted on the first lead frame such that the second terminal of the first semiconductor die faces and electrically connects with the die pad of the first lead frame;

wherein the second semiconductor die is mounted on the second lead frame such that the second terminal of the second semiconductor die faces and electrically connects with the die pad of the second lead frame, and wherein the first clip frame is attached to the first and second semiconductor dies such that the first die mating pad faces and electrically connects with the first terminal of the first semiconductor die and such that the second die mating pad faces and electrically connects with the first terminal of the second semiconductor die.

12. The semiconductor package of claim 11, further comprising a package body of electrically insulating encapsulant t material that encapsulates the first semiconductor die and the second semiconductor die, and wherein the contacts from the first lead frame are exposed at a first edge side of the package body, the contacts from the second lead frame are exposed at a second edge side of the package body that is opposite from the first edge side of the package body, and the bridge section is exposed at a central region of the package body that is in between the first and second edge sides of the package body.

13. The semiconductor package of claim 12, wherein lower surfaces of the contacts from the first and second lead frames and the bridge section are each substantially coplanar with a lower side of the package body.

14. The semiconductor package of claim 12, wherein the first and second semiconductor dies each comprise a third terminal disposed on the upper surface of the respective die, and wherein the semiconductor package further comprises second and third clip frames, each comprising a die mating pad and an external contact portion attached to the die mating pad, wherein the second clip frame is attached to the first semiconductor die such that the die mating pad of the second clip frame faces and electrically connects with the third terminal of the first semiconductor die, wherein the third clip frame is attached to the second semiconductor die such that the die mating pad of the third clip frame faces and electrically connects with the third terminal of the second semiconductor die, and wherein the external contact portions of the second and third clip frames are each exposed at the central region of the package body that is in between the first and second edge sides of the package body.

15. The semiconductor package of claim 14, wherein the package body comprises third and fourth edge sides that are arranged opposite one another and each extend between the first and second edge sides, wherein the external contact portions of the second and third clip frames comprise a protruding contact, and wherein the protruding contact from the second clip frame protrudes out from the third edge side and the protruding contact from the third clip frame protrudes out from the fourth edge side.

16. The semiconductor package of claim 11, wherein the first and second semiconductor dies are each silicon carbide devices.

17. The semiconductor package of claim 11, wherein the first and second semiconductor dies are each gallium nitride devices.

18. A semiconductor package, comprising:

first and second lead frames, each comprising a die pad and a plurality of contacts that are connected to the die pad;

first and second semiconductor dies mounted on the die pads of the first and second lead frames, respectively, each of the first and second semiconductor dies being transistor dies;

a first clip frame that comprises a first die mating pad, a second die mating pad, and a bridge section that extends between the first and second die mating pads; and a package body of electrically insulating encapsulant material that encapsulates the first semiconductor die and the second semiconductor die, wherein the first and second semiconductor dies are arranged as a bidirectional switch that is configured to control current flowing in two directions, wherein the contacts of the first and second lead frames form input-output terminals of the bidirectional switch that are exposed from the package body, and wherein the bridge section forms a central terminal of the bidirectional switch that is exposed from the package body.

19. The semiconductor package of claim 18, wherein the contacts from the first lead frame are exposed at a first edge side of the package body, wherein the contacts from the second lead frame are exposed at a second edge side of the package body that is opposite from the first edge side of the package body, and wherein the bridge section is exposed at a central region of the package body that is in between the first and second edge sides of the package body.

20. The semiconductor package of claim 19, further comprising second and third clip frames that are connected with gate terminals of the first and second semiconductor dies, respectively, and wherein the second and third clip frames comprise external contact portions that are exposed at the central region of the package body.

21. The semiconductor package of claim 20, wherein the first and second semiconductor dies are configured as MOSFET devices, and wherein the first clip frame connects source terminals of the first and second semiconductor dies together.

* * * * *